(12) United States Patent
Yu et al.

(10) Patent No.: US 12,317,437 B2
(45) Date of Patent: May 27, 2025

(54) SUPPORT DEVICE AND ELECTRONIC APPARATUS

(71) Applicant: Lenovo (Beijing) Limited, Beijing (CN)

(72) Inventors: Rui Yu, Beijing (CN); Baolin Liu, Beijing (CN)

(73) Assignee: LENOVO (BEIJING) LIMITED, Beijing (CN)

(*) Notice: Subject to any disclaimer, the term of this patent is extended or adjusted under 35 U.S.C. 154(b) by 183 days.

(21) Appl. No.: 18/072,625

(22) Filed: Nov. 30, 2022

(65) Prior Publication Data
US 2023/0171906 A1    Jun. 1, 2023

(30) Foreign Application Priority Data

Nov. 30, 2021    (CN) .......................... 202111450172.5

(51) Int. Cl.
*H05K 5/02*    (2006.01)
*F16M 11/04*    (2006.01)

(52) U.S. Cl.
CPC .......... *H05K 5/0234* (2013.01); *F16M 11/046* (2013.01); *F16M 2200/047* (2013.01)

(58) Field of Classification Search
CPC .......................... H05K 5/0017; H05K 5/0217
USPC ......................................................... 361/807
See application file for complete search history.

(56) References Cited

U.S. PATENT DOCUMENTS

| | | | |
|---|---|---|---|
| 2017/0082237 A1 | 3/2017 | Yeh et al. | |
| 2017/0261150 A1* | 9/2017 | Lee | F16M 11/046 |
| 2019/0226629 A1* | 7/2019 | Chen | F16M 11/2014 |
| 2019/0226630 A1* | 7/2019 | Chen | F16M 11/2014 |
| 2022/0049814 A1* | 2/2022 | Lee | F16M 11/18 |

\* cited by examiner

*Primary Examiner* — Hung S. Bui
(74) *Attorney, Agent, or Firm* — ANOVA LAW GROUP, PLLC

(57) ABSTRACT

A support device includes a support structure, a carrier assembly, and an elastic assembly. The carrier assembly is configured to support a display device. The carrier assembly ascends and descends relative to the support structure. The elastic assembly is connected to the support structure and the carrier assembly and provides different support forces to the carrier assembly to support display devices of different weights.

18 Claims, 6 Drawing Sheets

SUPPORT DEVICE AND ELECTRONIC APPARATUS

CROSS-REFERENCE TO RELATED APPLICATION

This application claims priority to Chinese Patent Application No. 202111450172.5, filed on Nov. 30, 2021, the entire content of which is incorporated herein by reference.

TECHNICAL FIELD

The present disclosure relates to a support device and an electronic apparatus.

BACKGROUND

A support device is a commonly used device. However, the current support device has limited types and poor adaptability.

SUMMARY

Embodiments of the present disclosure provide a support device, including a support structure, a carrier assembly, and an elastic assembly. The carrier assembly is configured to support a display device. The carrier assembly ascends and descends relative to the support structure. The elastic assembly is connected to the support structure and the carrier assembly and provides different support forces to the carrier assembly to support display devices of different weights.

Embodiments of the present disclosure provide an electronic apparatus, including a display device and a support device. The support device includes a support structure, a carrier assembly, and an elastic assembly. The carrier assembly is configured to support a display device. The carrier assembly ascends and descends relative to the support structure. The elastic assembly is connected to the support structure and the carrier assembly and provides different support forces to the carrier assembly to support display devices of different weights.

The support device of embodiments of the present disclosure includes the support structure, the carrier assembly configured to support the display device, and the elastic assembly. The carrier assembly can ascend and descend relative to the support structure. The elastic assembly may be connected to the support structure and the carrier assembly and provide different support forces to the carrier assembly to support the display devices of different weights. By providing different support forces to the carrier assembly through the elastic assembly can enable the support assembly to support the display devices of different weights, which has various application types and strong adaptability compared to the support device that can only support the display device of a single weight.

REFERENCE NUMERALS

100 Support structure;
110 Bottom base;
120 Column;
130 Second slide member;
140 Fourth elastic member;
200 Carrier assembly;
210 Carrier;
211 First connection piece;
212 Second connection piece;
213 Concave member;
214 Convex table;
220 Ascending and descending structure;
221 Slide rail;
222 First slide member;
223 First chamber body;
224 Second chamber body;
225 Snap table;
300 Elastic assembly;
310 First elastic assembly;
311 First elastic member;
312 Second elastic member;
313 Plug position;
320 Second elastic assembly;
321 First connector;
322 Third elastic member.

DETAILED DESCRIPTION OF THE EMBODIMENTS

The technical solutions of the present disclosure are further described below with reference to the accompanying drawings and specific embodiments of the present disclosure.

In the description of embodiments of the present disclosure, unless otherwise specified and limited, the term "connection" should be understood in a broad sense. For example, the "connection" may be an electrical connection, or an internal communication between two components, or a direct connection, and may also be an indirect connection through an intermediate medium. For those of ordinary skill in the art, specific meanings of the above term can be understood according to specific situations.

The term "first\second\third" involved in embodiments of the present disclosure is only used to distinguish similar objects and does not represent a specific order of the objects. For the "first\second\third," a specific order or sequence may be interchanged where permitted. The objects distinguished by "first\second\third" may be interchanged under an appropriate circumstance. Thus, embodiments of the present disclosure described here may be practiced in a sequence other than a sequence illustrated or described here.

A support device of embodiments of the present disclosure is described in detail below with reference to FIGS. 1 to 6.

Figure 1:
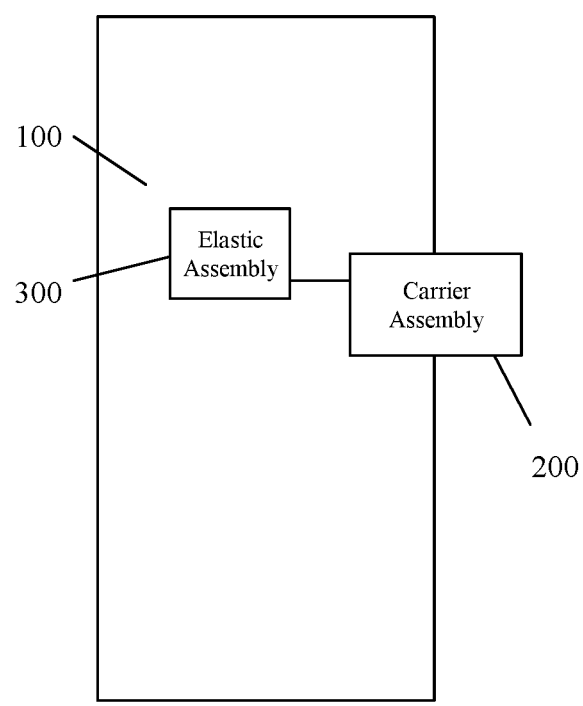
FIG. 1 illustrates a schematic structural diagram of a support device according to embodiments of the present disclosure.

As shown in FIG. 1, the support device includes a support structure 100, a carrier assembly 200 configured to support a display device, and an elastic assembly 300. The carrier assembly 200 may ascend and descend relative to the support structure 100. The elastic assembly 300 may be configured to be connected to the support structure 100 and the carrier assembly 200. The elastic assembly 300 can provide different support forces to the carrier assembly 200 to support display devices with different weights. By providing different support forces to the carrier assembly 200 through the elastic assembly 300, the support assembly may be configured to support the display devices with different weights, which has various types of applications and strong adaptability compared to a support device that can only support a display device with a single weight.

In embodiments of the present disclosure, a structure of the support structure 100 may not be limited. For example, the support structure 100 may have a plate-shaped structure, a block-shaped structure, a column-shaped structure, or a "T"-shaped structure.

In embodiments of the present disclosure, a structure of the carrier assembly 200 may not be limited. For example, the carrier assembly 200 may have a plate-shaped structure, a block-shaped structure, a shaft-shaped structure, or a column-shaped structure.

An implementation manner for ascending and descending of the carrier assembly 200 relative to the support structure 100 may not be limited. For example, the support structure 100 may include a slide rod, and the carrier assembly 200 may be sleeved on the slide rod. The carrier assembly 200 can move relative to the slide rod to realize the ascending and descending of the carrier assembly 200 relative to the support structure 100.

Figure 3:
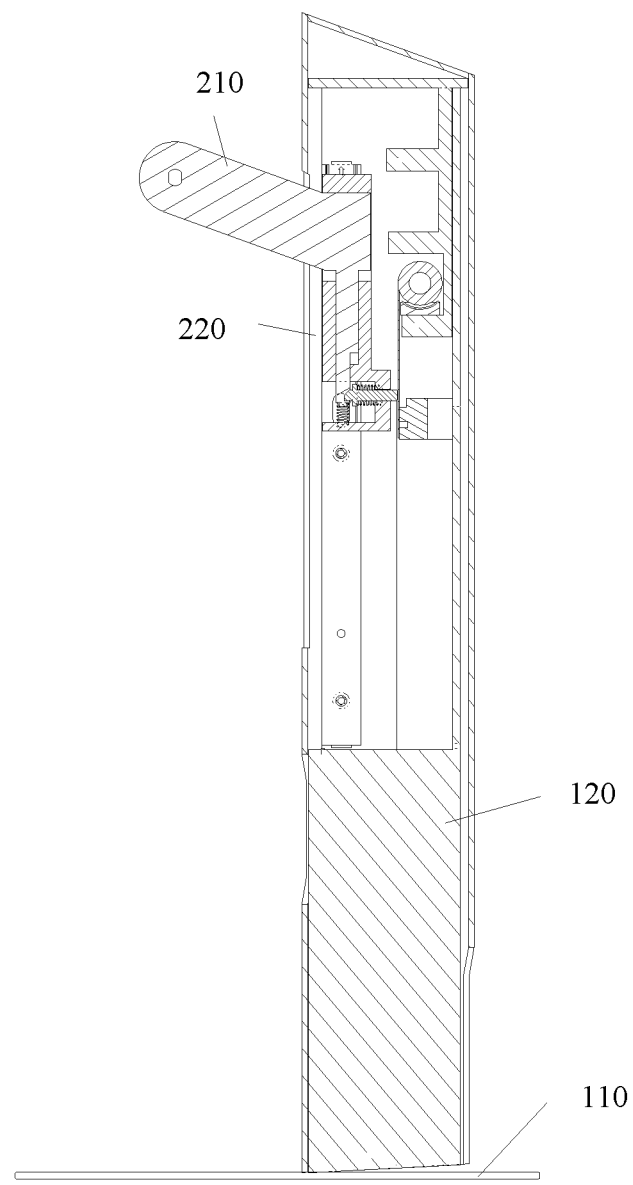
FIG. 3 illustrates a schematic structural diagram of a support device according to embodiments of the present disclosure.

In some embodiments, as shown in FIG. 3, the support structure 100 includes a base 110 and a column 120 arranged on the base 110 in a vertical direction. The carrier assembly 200 includes a carrier 210 and an ascending and descending structure 220 that can ascend and descend along the column 120. The carrier 210 may be configured to fix the display device. The carrier 210 may be connected to the ascending and descending structure 220. Thus, the display device may be displaced in the vertical direction.

In some embodiments, a structure of the base 110 may not be limited. For example, the base 110 may have a plate-shaped structure or a block-shaped structure.

In some embodiments, a structure of the column 120 may not be limited. For example, the column 120 may have a strip-shaped structure, a plate-shaped structure, or a column-shaped structure.

Figure 4:
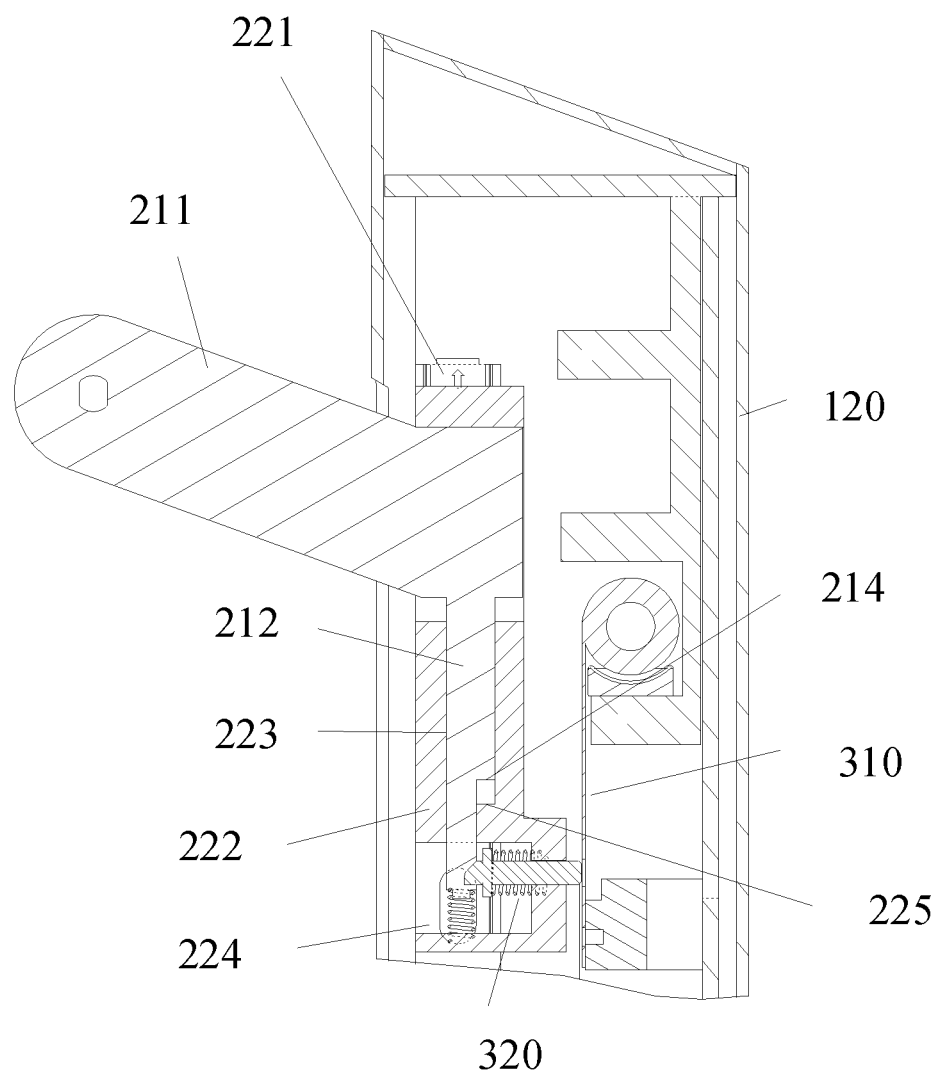
FIG. 4 illustrates a schematic structural diagram of a partial support device according to embodiments of the present disclosure.

In some embodiments, a manner in which the ascending and descending structure 220 ascends and descends along the column 120 may not be limited. For example, as shown in FIG. 3 and FIG. 4, a slide rail 221 is arranged in an ascending and descending direction of the column 120. The ascending and descending structure 220 may move along the slide rail 221 in the ascending and descending direction. In some embodiments, the carrier 210 may be fixedly connected to or movably connected to the ascending and descending structure 220.

For example, as shown in FIG. 4, the ascending and descending structure 220 includes a first slide member 222 that can move along the slide rail 221 in the ascending and descending direction. The first slide member 222 includes a first chamber body 223 along the ascending and descending direction and a second chamber body 224 along a first direction. The first chamber body 223 and the second chamber body 224 may be communicated with each other in the ascending and descending direction. The carrier 210 includes a first connection piece 211 and a second connection piece 212 with a predetermined angle. The first connection piece 211 may be configured to fix the display device. The second connection piece 212 may be sleeved inside the first chamber body 223 and may move toward the second chamber body 224.

The ascending and descending structure 220 may further include a damping member. The damping member may be configured to provide a damping force for the first slide member 222 to move along the slide rail 221 in the ascending and descending direction. Thus, the first slide member 222 can move smoothly. The damping member here may have an elastic structure.

The second connection piece 212 may be located in a chamber body of the column. A part of the first connection piece 211 configured to be connected to the display device may be extended outside of the column through a case of the column. The case of the column may also include an opening corresponding to the first connection piece 211. Thus, when the first slide member 222 ascends and descends relative to the column, the part of the first connection piece 211 configured to be connected to the display device may move within the opening. In embodiments of the present disclosure, a structure of the elastic assembly 300 may not be limited, as long as the elastic assembly 300 is connected to the support structure 100 and the carrier assembly 200 and may provide different support forces to the carrier assembly 200 to support display devices with different weights.

Figure 2:
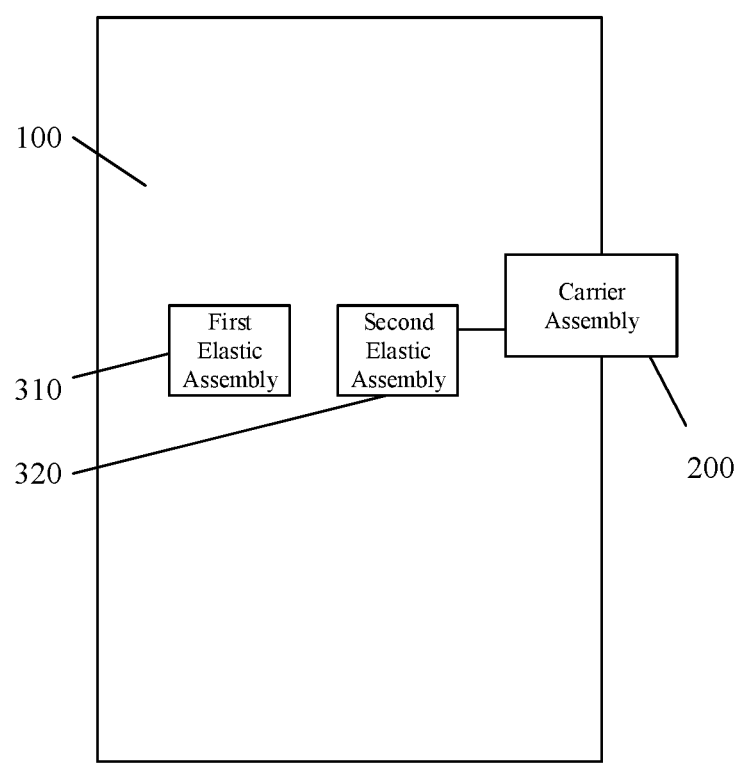
FIG. 2 illustrates a schematic structural diagram of a support device according to embodiments of the present disclosure.

In embodiments of the present disclosure, as shown in FIG. 2, the elastic assembly 300 includes a first elastic assembly 310 and a second elastic assembly 320. The first elastic assembly 310 is arranged along the ascending and descending direction of the carrier assembly 200 relative to the support structure 100. A fixed end of the first elastic assembly 310 is connected to the support structure 100. The second elastic assembly 320 is movably connected to the carrier assembly 200. The second elastic assembly 320 may move in the first direction as the carrier assembly 200 ascends and descends. The first direction may be perpendicular to the ascending and descending direction of the carrier assembly 200. The second elastic assembly 320 may have a connection state and a disconnection state with at least a part of a free end of the first elastic assembly 310. In the connection state, the first elastic assembly 310 may cooperate with the second elastic assembly 320 to provide a first support force to the carrier assembly 200. In the disconnection state, the first elastic assembly 310 may provide a second support force to the carrier assembly 200. The second support force may be different from the first support force. Thus, different support forces may be provided according to the connection state and the disconnection state between the second elastic assembly 320 and at least a part of the free end of the first elastic assembly 310.

In some embodiments, a structure of the first elastic assembly 310 may not be limited.

For example, the first elastic assembly 310 may include at least one first elastic member 311 and at least one second elastic member 312. A fixed end of the first elastic member 311 may be connected to the column 120. A free end of the first elastic member 311 may be fixedly connected to the first slide member 222. A fixed end of the second elastic member 312 may be connected to the column 120. A free end of the second elastic member 312 may have a connection state and a disconnection state with the second elastic assembly 320.

In some embodiments, in the connection state, the at least one first elastic member 311 and the at least one second elastic member 312 may provide a first support force to the carrier assembly 200 together. In the disconnection state, the at least one first elastic member 311 may provide a second support force to the carrier assembly 200.

In some embodiments, positions of the first elastic member 311 and the second elastic member 312 may not be limited. For example, the first elastic member 311 and the second elastic member 312 may be both arranged in the chamber body of the column 120.

In some embodiments, a number of first elastic members 311 may not be limited, and a number of second elastic members 312 may not be limited. For example, as shown in FIG. 6, the first elastic assembly 310 includes two first elastic members 311 and one second elastic member 312.

In some embodiments, structures of the first elastic member 311 and the second elastic member 312 may not be limited. For example, the first elastic member 311 may be a first tension spring. The second elastic member 312 may be a second tension spring. A fixed end of the first elastic member 311 may be fixedly connected to the column 120, and a fixed end of the second elastic member 312 may be fixedly connected to the column 120. For another example, as shown in FIG. 6, the first elastic member 311 is a first constant force spring, and the second elastic member 312 is a second constant force spring. The fixed end of the first elastic member 311 may be rotatably connected to the column 120. The fixed end of the second elastic member 312 may be rotatably connected to the column 120.

Figure 5:
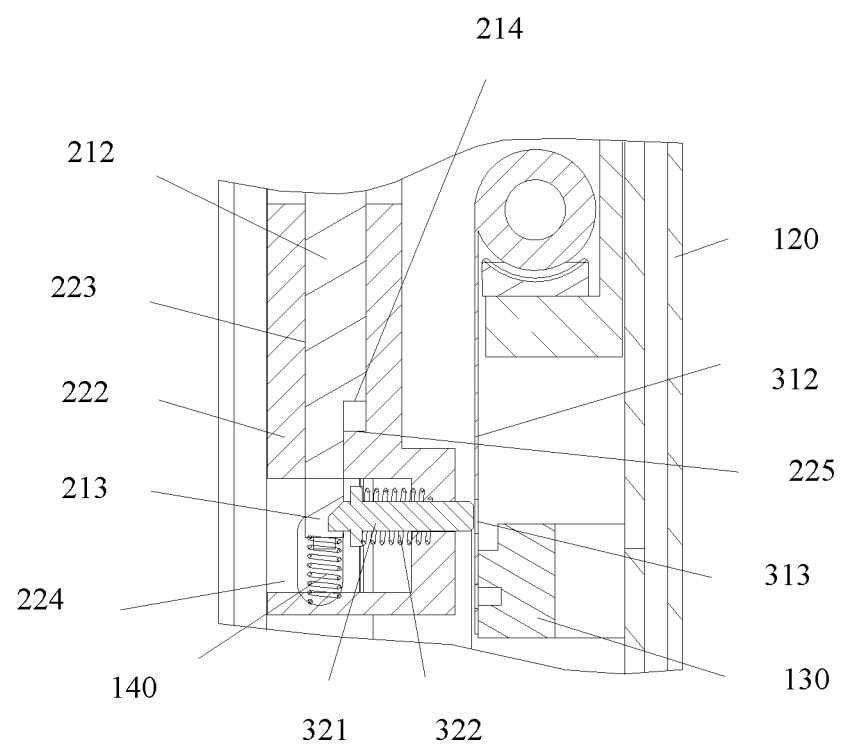
FIG. 5 illustrates a schematic structural diagram of a partial support device according to embodiments of the present disclosure.
Figure 6:
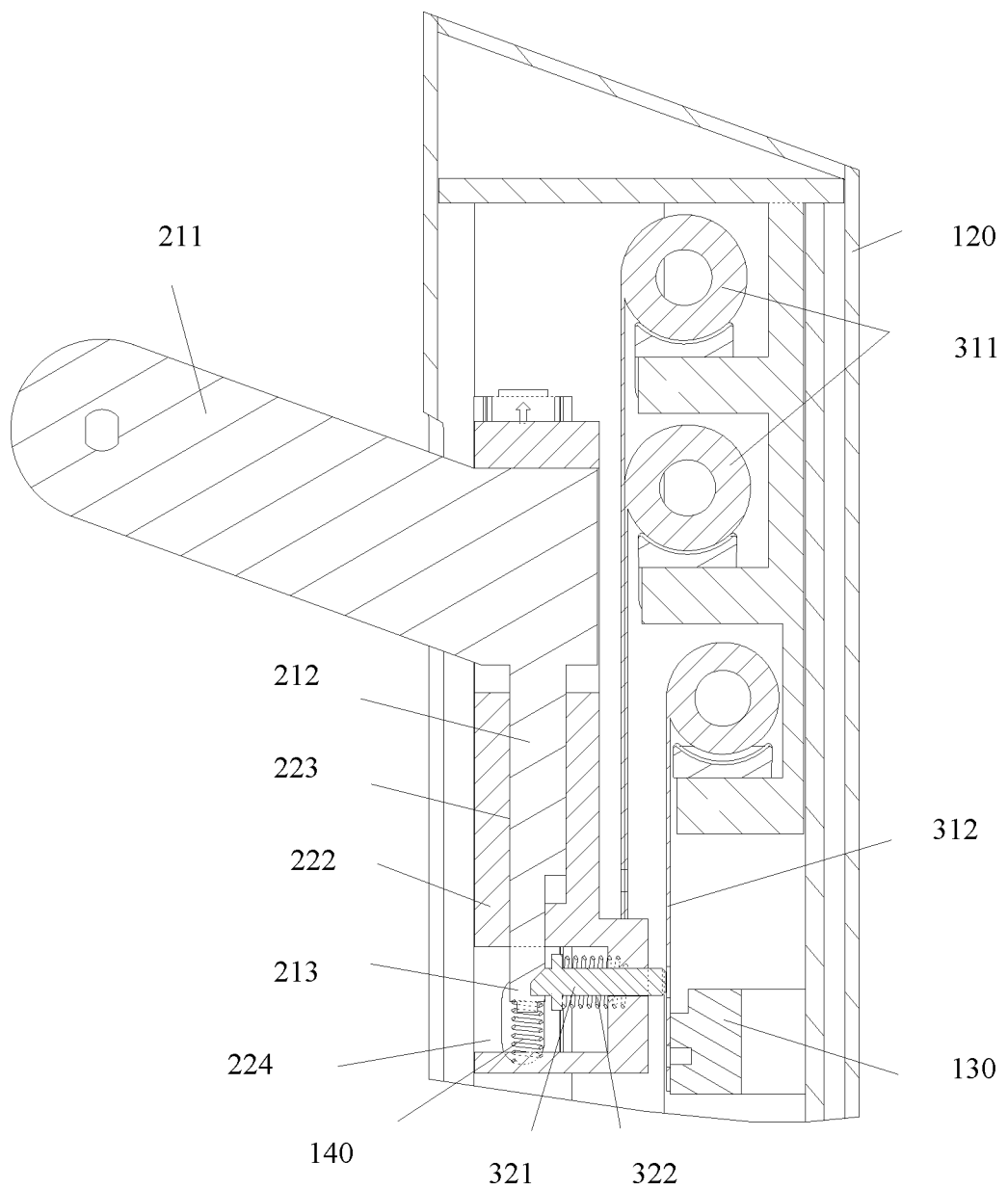
FIG. 6 illustrates a schematic structural diagram of a partial support device according to embodiments of the present disclosure.

In some embodiments, as shown in FIGS. 5 and 6, the second slide member 130 that moves along the ascending and descending direction is arranged in the column 120. A free end of the second elastic member 312 is fixedly connected to the second slide member 130. Thus, the free end of the second elastic member 312 may be in an extended state. A chute or a slide rail may be arranged in the chamber body of the column. A part of the second slide member 130 may be clamped in the chute or on the slide rail. The second slide member 130 may move along the chute or the slide rail.

In some embodiments, the first elastic assembly 310 may only include at least one second elastic member 312. The fixed end of the second elastic member 312 may be connected to the column 120. The free end of the second elastic member 312 may have a connection state or a disconnection state with the second elastic assembly 320. In the connection state, at least one second elastic member 312 may provide a first support force to the carrier assembly 200. In the disconnection state, no support force may be provided to the carrier assembly 200. That is, the provided second support force may be zero. Thus, the carrier assembly 200 may be supported by another structure. For example, the carrier assembly 200 may be supported by a damping structure.

In some embodiments, a structure of the second elastic assembly 320 may not be limited. At least a part of the second elastic assembly 320 may be arranged in the second chamber body 224 to move in the first direction in cooperation with the ascending and descending of the second connection piece 212 in the second chamber body 224.

For example, as shown in FIG. 4 and FIG. 5, the second elastic assembly 320 includes a first connection member 321 and a third elastic member 322. The first connection member 321 may move in the first direction relative to a first side wall of the second chamber body 224 under the action of the third elastic member 322 and the second connection piece 212 to realize the connection or disconnection to the first elastic assembly 310.

In some embodiments, the structure of the first connector 321 is not limited. For example, the first connector 321 may have a strip-shaped structure. For another example, the first connector 321 may have a column-shaped structure.

In some embodiments, a structure of the third elastic member 322 may not be limited. For example, the third elastic member 322 may be a third spring. The third elastic member 322 may be sleeved on an outer side of the first connector 321. The third elastic member 322 may abut against the first connector 321 and the first slide member 222. The third elastic member 322 may be configured to make the first connector 321 in a position of being disconnected from the first elastic assembly 310 through a deformation force.

In some embodiments, the support device may further include a fourth elastic member 140 arranged on a bottom wall of the second chamber body 224. The direction of the elastic force of the fourth elastic member 140 may be consistent with the movement direction of the second connection piece 212. The fourth elastic member 140 may provide a resistance to the second connection piece 212 when moving downward. Thus, when the first connection piece 211 is connected to a relatively light display device, the fourth elastic member 140 may cause the second connection piece to be at the first position relative to the first slide member 222. Thus, the first connector 321 may be at a position under the deformation force of the third elastic member 322, at which the first connector 321 is disconnected from at least a part of the first elastic assembly 310. When the first connection piece 211 is connected to a relatively heavy display device, the second connection piece 212 may overcome the elastic force of the fourth elastic member 140 to move to the second position relative to the first slide member 222. The second connection piece 212 may overcome the elastic force of the third elastic member 322 to push the first connector 321 to move in the first direction to a position to be connected to the at least a part of the first elastic assembly 310. Thus, the at least a part of the first elastic assembly 310 may support the display device through the first connector 321.

The structure of the fourth elastic member 140 may not be limited. For example, the fourth elastic member 140 may be a spring.

As shown in FIG. 4 and FIG. 5, in order to ensure that the second connection piece 212 is stable at the second position, a snap table 225 is arranged on a side of the first chamber body 223. A convex table 214 is arranged on a surface of the second connection piece. When the second connection piece 212 moves to a position where the convex table 214 abuts against the snap table 225, the second connection piece 212 may move to the second position.

The manner in which the second connection piece 212 can overcome the deformation force of the third elastic member 322 to push the first connector 321 to move in the first direction to the position to be connected to the at least a part of the first elastic assembly 310 is not limited.

For example, as shown in FIG. 5 and FIG. 6, a concave member 213 is arranged on a side of the second connection piece 212 facing the first connector 321. The second connection piece 212 may ascend and descend in the second chamber body 224 to cause the first connector 321 to abut or not abut against the concave member 213. When a first end of the first connector 321 abuts the concave member 213, a second end of the first connector 321 may be disconnected from at least a part of the first elastic assembly 310. When the first end of the first connector 321 does not abut against the concave member 213, the second end of the first connector 321 may be connected to the at least a part of the first elastic assembly 310.

When the first connection piece 211 is connected to a display device with a first weight, the second connection piece 212 may be at the first position relative to the first slide member 222. The first end of the first connector 321 may abut against concave member 213, and the second end of the first connector 321 may be disconnected from the at least a part of the first elastic assembly 310. When the first connection piece 211 is connected to the display device with a second weight, the second connection piece 212 may move relative to the first slide member 222. The first end of the first connector 321 may move out from the concave member 213 in a first direction. The second end of the first connector 321 may be connected to the at least a part of the first elastic assembly 310. Thus, the second connection piece 212 may be at the second position relative to the first slide member 222. The first weight may be smaller than the second weight.

When the first elastic assembly 310 includes at least one first elastic member 311 and at least one second elastic member 312, the first end of the first connector 321 may be connected to or disconnected from the at least one second elastic member 312. When the first end of the first connector 321 is connected to the at least one second elastic member 312, the at least one first elastic member 311 and the at least one second elastic member 312 may together provide the first support force to the first slide member 222. Thus, the first slide member 222 may drive the display device of the second weight to move in the ascending and descending direction to adjust a height of the display device relative to the base 110. When the first end of the first connector 321 is disconnected from the at least one second elastic member 312, the at least one first elastic member 311 may provide the second support force to the first slide member 222. Thus, the first slide member 222 may drive the display device of the first weight to move in the ascending and descending direction to adjust the height of the display device relative to the base 110.

A manner in which the first end of the first connector 321 is connected to or disconnected from the at least one second elastic member 312 is not limited.

For example, the free end of the second elastic member 312 may include a plug position 313 configured to plug the first connector 321 to realize the connection between the first elastic member 310 and the second elastic member 320.

A structure of the plug position 313 is not limited. For example, as shown in FIG. 5, the plug position 313 is a through-hole arranged at the free end of the second elastic member 312.

When the first end of the first connector 321 abuts against the concave member 213, the second end of the first connector 321 may be disconnected from the plug position 313. When the first end of the connector 321 dose not abut against the concave member 213, the second end of the first connector 321 may be connected to the plug position 313.

When the first connection piece 211 is connected to the display device with the first weight, the second connection piece 212 may be at the first position relative to the first slide member 222. The first end of the first connector 321 may abut against the concave member 213. The second end of the first connector 321 may be disconnected from the plug position 313. When the first connection piece 211 is connected to the display device of the second weight, the second connection piece 212 may move from the first position to the second position relative to the first slide member 222. The concave member 213 may move with the second connection piece 212 to force the first end of the first connector 321 to move from inside the concave member 213 in the first direction to cause the second end of the first connector 321 to be connected to the plug position 313.

When the second connection piece 212 is at the first position relative to the first slide member 222, the first connection piece 211 may be at a higher position relative to the base. When the second connection piece 212 is at the second position relative to the first slide member 222, the first connection piece 211 may be at a lower position relative to the base.

The first elastic assembly 310 may include two second elastic members 312. When the first connection piece 211 is connected to the display device with the first weight, the second connection piece 212 may be at the first position relative to the first slide member 222. The second elastic assembly 320 may be disconnected from the two second elastic members 312. When the first connection piece 211 is connected to the display device of the second weight, the second connection piece 212 may be at the second position relative to the first slide member 222. The second elastic assembly 320 may be connected to the second elastic member 312. When the first connection piece 211 is connected to the display device with the third weight, the second connection piece 212 may be at the third position relative to the first slide member 222. The second elastic assembly 320 may be connected to the two second elastic members 312.

When the second connection piece 212 is at the first position relative to the first slide member 222, the first connection piece 211 may be at a higher position relative to the base. When the second connection piece 212 is at the second position relative to the first slide member 222, the first connection piece 211 may be in a middle position relative to the base. When the second connection piece 212 is at the second position relative to the first slide member 222, the first connection piece 211 may be at the lower position relative to the base.

The concave member may include a first concave member and a second concave member. When the first connection piece 211 is connected to the display device with the first weight, the second connection piece 212 may be at the first position relative to the first slide member 222. The first end of the first connector 321 may abut against the first concave member. The second end of the first connector 321 may be disconnected from the plug positions 313 of the two second elastic members 312. When the first connection piece 211 is connected to the display device of the second weight, the second connection piece 212 may move from the first position to the second position relative to the first slide member 222. The first concave member and the second concave member may move with the second connection piece 212 to force the first end of the first connector 321 to slide out from inside the first concave member and move in the first direction. Thus, the second end of the first connector 321 may be connected to the plug position 313 of one second elastic member 312. Thus, the first end of the first connector 321 may be located in the second concave member. When the first connection piece 211 is connected to the display device with the third weight, the second connection piece 212 may move from the second position to the third position relative t the first slide member 222. The first concave member and the second concave member may move with the second connection piece 212 to force the first end of the first connector 321 to slide out from inside of the second concave member and move in the first direction. Thus, the second end of the first connector 321 may be connected to the plug positions 313 of the two second elastic members 312.

One concave member 213 and one convex member may be arranged on a side of the second connection piece 212 facing the first connector 321. The concave member 213 here may have a similar function as the first concave member, and the convex member may have a similar function as the second concave member.

The third weight may be greater than the second weight.

In embodiments of the present disclosure, the support device may include a support structure 100, a carrier assembly 200, and an elastic assembly 300. The carrier assembly 200 may be configured to support the display device. The carrier assembly 200 may ascend and descend relative to the support structure 100. The elastic assembly 300 may be configured to be connected to the support structure 100 and the carrier assembly 200 and provide different support forces to the carrier assembly 200 to support the display devices of different weights. By providing different support forces to the carrier assembly 200 through the elastic assembly 300, the carrier assembly 200 may carry the display devices of different weights, which has various application types and strong adaptability compared with the support device that can only support the display device of the single weight.

Embodiments of the present disclosure further provide an electronic apparatus, which includes a display device and the support device of embodiments of the present disclosure.

The above are only specific embodiments of the present disclosure, but the scope of the present disclosure is not limited to this. Those skilled in the art may think of modifications or replacements within the technical scope of the present disclosure. These modifications and replacements should be within the scope of the present disclosure. Therefore, the scope of the present application should be subject to the scope of the claims.

What is claimed is:

1. A support device comprising:
a support structure;
a carrier assembly configured to support a display device, the carrier assembly ascending and descending relative to the support structure; and
an elastic assembly connected to the support structure and the carrier assembly and providing different support forces to the carrier assembly to support display devices of different weights;
wherein:
the elastic assembly includes:
a first elastic assembly including at least one second elastic member and at least one first elastic member, a fixed end of the at least one second elastic member being connected to the support structure; and
a second elastic assembly movably connected to the carrier assembly; and
a free end of the at least one second elastic member has a connection state and a disconnection state with the second elastic assembly:
in the connection state, the at least one second elastic member provides a support force to the carrier assembly; and
in the disconnection state, the second elastic member does not provide the support force to the carrier assembly.

2. The support device of claim 1, wherein:
the first elastic assembly is arranged along an ascending and descending direction of the carrier assembly relative to the support structure; and
the second elastic assembly moves in a first direction along with ascending and descending of the carrier assembly, the first direction being perpendicular to the ascending and descending direction of the carrier assembly;
wherein a fixed end of the at least one first elastic member is connected to the support structure, a free end of the at least one first elastic member is connected to the carrier assembly, and the second elastic assembly has a connection state and a disconnection state with at least a part of a free end of the first elastic assembly:
in the connection state, the first elastic assembly and the second elastic assembly cooperate to provide a first support force to the carrier assembly; and
in the disconnection state, the first elastic assembly provides a second support force to the carrier assembly through the at least one first elastic member, the second support force being different from the first support force.

3. The support device according to claim 2, wherein:
the support structure includes:
a base; and
a column arranged on the base in a vertical direction; and
the carrier assembly includes:
a carrier configured to fix the display device; and
an ascending and descending structure ascending and descending along the column, the carrier being connected to the ascending and descending structure to cause the display device to be able to move in the vertical direction.

4. The support device according to claim 3, wherein:
a slide rail is arranged in the ascending and descending direction of the column;
the ascending and descending structure includes:
a first slide member moving along the slide rail in the ascending and descending direction and including:
a first chamber body arranged along the ascending and descending direction; and
a second chamber body arranged along the first direction, the first chamber body being communicated with the second chamber body in the ascending and descending direction;
the carrier includes:
a first connection piece configured to fix the display device; and
a second connection piece sleeved inside the first chamber body and moving towards the second chamber body, the first connection piece and the second connection piece having a predetermined angle; and
at least a part of the second elastic assembly is arranged in the second chamber body to cooperate with the second connection piece to move to ascend and descend in the second chamber body in the first direction.

5. The support device according to claim 4, wherein the second elastic assembly includes:
a third elastic member; and
a first connector moving in the first direction relative to a first side wall of the second chamber body under an action of the third elastic member and the second connection piece to be connected to or disconnected from the first elastic assembly.

6. The support device according to claim 5, wherein:
the fixed end of the at least one first elastic member is connected to the column, and the free end of the at least one first elastic member is fixedly connected to the first slide member; and the fixed end of the at least one second elastic member is connected to the column, and the free end of the at least one second elastic member includes a plug position configured to plug the first connector in to connect the first elastic assembly and the second elastic assembly.

7. The support device according to claim 6, wherein:
a second slide member moving in the ascending and descending direction is arranged in the column, and the free end of the second elastic member is fixedly connected to the second slide member; and/or
the support device further includes a fourth elastic member arranged on a bottom wall of the second chamber body and providing a resistance to the second connection piece when moving downward, a direction of an elastic force of the fourth elastic member being consistent with a movement direction of the second connection piece.

8. The support device according to claim 6, wherein:
a concave member is arranged on a side of the second connection piece facing the first connector;
the second connection piece ascends and descends in the second chamber body to cause the first connector to abut against or not abut against the concave member;
in response to a first end of the first connector abutting against the concave member, a second end of the first connector is disconnected from the plug position; and
in response to the first end of the first connector not abutting against the concave member, the second end of the first connector is connected to the plug position.

9. The support device according to claim 8, wherein:
in response to the first connection piece being connected to a display device of a first weight, the second connection piece is at a first position relative to the first slide member, the first end of the first connector abuts against the concave member, and the second end of the first connector is disconnected from the plug position;
in response to the first connection piece being connected to a display device with a second weight, the second connection piece moves relative to the first slide member, and the first end of the first connector slides out from inside of the concave member to move in the first direction to cause the second end of the first connector to be connected to the plug position; and
the first weight is less than the second weight.

10. An electronic apparatus comprising:
a display device; and
a supporting device including:
a support structure;
a carrier assembly configured to support the display device, the carrier assembly ascending and descending relative to the support structure; and
an elastic assembly connected to the support structure and the carrier assembly and providing different support forces to the carrier assembly to support display devices of different weights;
wherein:
the elastic assembly includes:
a first elastic assembly including at least one second elastic member and at least one first elastic member, a fixed end of the at least one second elastic member being connected to the support structure; and
a second elastic assembly movably connected to the carrier assembly; and
a free end of the at least one second elastic member has a connection state and a disconnection state with the second elastic assembly:
in the connection state, the at least one second elastic member provides a support force to the carrier assembly; and
in the disconnection state, the second elastic member does not provide the support force to the carrier assembly.

11. The electronic apparatus of claim 10, wherein:
the first elastic assembly is arranged along an ascending and descending direction of the carrier assembly relative to the support structure; and
the second elastic assembly moves in a first direction along with ascending and descending of the carrier assembly, the first direction being perpendicular to the ascending and descending direction of the carrier assembly;
wherein a fixed end of the at least one first elastic member is connected to the support structure, a free end of the at least one first elastic member is connected to the carrier assembly, and the second elastic assembly has a connection state and a disconnection state with at least a part of a free end of the first elastic assembly:
in the connection state, the first elastic assembly and the second elastic assembly cooperate to provide a first support force to the carrier assembly; and
in the disconnection state, the first elastic assembly provides a second support force to the carrier assembly through the at least one first elastic member, the second support force being different from the first support force.

12. The electronic apparatus according to claim 11, wherein:
the support structure includes:
a base; and
a column arranged on the base in a vertical direction; and
the carrier assembly includes:
a carrier configured to fix the display device; and
an ascending and descending structure ascending and descending along the column, the carrier being connected to the ascending and descending structure to cause the display device to be able to move in the vertical direction.

13. The electronic apparatus according to claim 12, wherein:
a slide rail is arranged in the ascending and descending direction of the column;
the ascending and descending structure includes:
a first slide member moving along the slide rail in the ascending and descending direction and including:
a first chamber body arranged along the ascending and descending direction; and
a second chamber body arranged along the first direction, the first chamber body being communicated with the second chamber body in the ascending and descending direction;
the carrier includes:
a first connection piece configured to fix the display device; and
a second connection piece sleeved inside the first chamber body and moving towards the second chamber body, the first connection piece and the second connection piece having a predetermined angle; and
at least a part of the second elastic assembly is arranged in the second chamber body to cooperate with the second connection piece to move to ascend and descend in the second chamber body in the first direction.

14. The electronic apparatus according to claim 13, wherein the second elastic assembly includes:
- a third elastic member; and
- a first connector moving in the first direction relative to a first side wall of the second chamber body under an action of the third elastic member and the second connection piece to be connected to or disconnected from the first elastic assembly.

15. The electronic apparatus according to claim 14, wherein:
- the fixed end of the at least one first elastic member is connected to the column, and the free end of the at least one first elastic member is fixedly connected to the first slide member; and
- the fixed end of the at least one second elastic member is connected to the column, and the free end of the at least one second elastic member includes a plug position configured to plug the first connector in to connect the first elastic assembly and the second elastic assembly.

16. The electronic apparatus according to claim 15, wherein:
- a second slide member moving in the ascending and descending direction is arranged in the column, and the free end of the second elastic member is fixedly connected to the second slide member; and/or
- the support device further includes a fourth elastic member arranged on a bottom wall of the second chamber body and providing a resistance to the second connection piece when moving downward, a direction of an elastic force of the fourth elastic member being consistent with a movement direction of the second connection piece.

17. The electronic apparatus according to claim 15, wherein:
- a concave member is arranged on a side of the second connection piece facing the first connector;
- the second connection piece ascends and descends in the second chamber body cause the first connector to abut against or not abut against the concave member;
- in response to a first end of the first connector abutting against the concave member, a second end of the first connector is disconnected from the plug position; and
- in response to the first end of the first connector not abutting against the concave member, the second end of the first connector is connected to the plug position.

18. The electronic apparatus according to claim 17, wherein:
- in response to the first connection piece being connected to a display device of a first weight, the second connection piece is at a first position relative to the first slide member, the first end of the first connector abuts against the concave member, and the second end of the first connector is disconnected from the plug position;
- in response to the first connection piece being connected to a display device with a second weight, the second connection piece moves relative to the first slide member, and the first end of the first connector slides out from inside of the concave member to move in the first direction to cause the second end of the first connector to be connected to the plug position; and
- the first weight is less than the second weight.

* * * * *